US009773690B2

(12) United States Patent
Morikawa et al.

(10) Patent No.: US 9,773,690 B2
(45) Date of Patent: Sep. 26, 2017

(54) SUBSTRATE PROCESSING APPARATUS, SUBSTRATE PROCESSING SYSTEM, AND METHOD OF DETECTING ABNORMALITY IN TRANSPORT CONTAINER

(71) Applicant: TOKYO ELECTRON LIMITED, Tokyo (JP)

(72) Inventors: Katsuhiro Morikawa, Koshi (JP); Ikuo Sunaka, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 197 days.

(21) Appl. No.: 14/649,673

(22) PCT Filed: Dec. 10, 2013

(86) PCT No.: PCT/JP2013/083066
§ 371 (c)(1),
(2) Date: Jun. 4, 2015

(87) PCT Pub. No.: WO2014/092074
PCT Pub. Date: Jun. 19, 2014

(65) Prior Publication Data
US 2016/0172225 A1    Jun. 16, 2016

(30) Foreign Application Priority Data
Dec. 10, 2012    (JP) .................................. 2012-269601

(51) Int. Cl.
*H01L 21/677*    (2006.01)
*H01L 21/67*    (2006.01)

(52) U.S. Cl.
CPC .. *H01L 21/67772* (2013.01); *H01L 21/67253* (2013.01); *H01L 21/67766* (2013.01);
(Continued)

(58) Field of Classification Search
CPC ................................................ H01L 21/67772
See application file for complete search history.

(56) References Cited

U.S. PATENT DOCUMENTS 6,591,162 B1 *   7/2003   Martin .............. H01L 21/67242
                                                        700/225
2011/0188977 A1   8/2011   Toyoda et al.

FOREIGN PATENT DOCUMENTS

JP    2002-164411 A1    6/2002
JP    2003-224182 A1    8/2003
(Continued)

OTHER PUBLICATIONS

English Translation of International Preliminary Report on Patentability (Chapter I) (Application No. PCT/JP2013/083066) dated Jun. 25, 2015.
(Continued)

*Primary Examiner* — Clayton E LaBalle
*Assistant Examiner* — Dennis Hancock
(74) *Attorney, Agent, or Firm* — Burr & Brown, PLLC

(57) ABSTRACT

A substrate processing apparatus includes: a load port into and out of which the transport container is carried; and an apparatus controller that controls operations in the load port. The apparatus controller includes a storage unit that stores transition data of parameter values sent from outside based on a transport container identification code. The transition data of the parameter values each comprises a usage count of the transport container and a corresponding parameter value that quantifies a result of at least one of an operation performed to remove the lid after the transport container is carried into the load port and an operation performed to carry the container out of the load port. The apparatus controller further includes a determination unit that determines, after a transport container is carried into the load port, presence or absence of an abnormality in that transport
(Continued)

container based on a parameter value associated with at least one of carrying-in or carrying-out of that transport container, and past transition data of parameter values associated with that transport container.

13 Claims, 13 Drawing Sheets

(52) U.S. Cl.
CPC .. *H01L 21/67769* (2013.01); *H01L 21/67775* (2013.01); *H01L 21/67778* (2013.01)

(56) References Cited

FOREIGN PATENT DOCUMENTS

| | | |
|---|---|---|
| JP | 2003-315197 A1 | 11/2003 |
| JP | 2004-119427 A1 | 4/2004 |
| JP | 2004-517463 A1 | 6/2004 |
| JP | 2011-091197 A1 | 5/2011 |
| JP | 2011-165719 A1 | 8/2011 |
| WO | 02/15234 A2 | 2/2002 |

OTHER PUBLICATIONS

Japanese Office Action (Application No. 2012-269601) dated Mar. 29, 2016 (with English translation).
International Search Report (Application No. PCT/JP2013/083066) dated Jan. 28, 2014.

* cited by examiner

SUBSTRATE PROCESSING APPARATUS, SUBSTRATE PROCESSING SYSTEM, AND METHOD OF DETECTING ABNORMALITY IN TRANSPORT CONTAINER

BACKGROUND OF THE INVENTION

Field of the Invention

The present invention relates to a technical field of monitoring an abnormality in a transport container in an apparatus that processes substrates having been carried into the apparatus with the use of the transport container.

Description of Related Art

In a semiconductor manufacturing factory, semiconductor substrates are contained in a transport container, and the transport container is transported to a semiconductor manufacturing apparatus by an automatic guided vehicle (AGV) or an overhead hoist transporter (OHT). The semiconductor manufacturing apparatus includes a carry-in and carry-out port for the transport container, and a processing block that processes semiconductor substrates. A sealed-type transport container provided on its front face with a lid is most widely used. For 12-inch semiconductor wafers, a transport container abbreviated as "FOUP" is used.

The FOUP includes a resin transport container (container main body), which is provided on its front face with a lid. Two key holes are formed in an outer face of the lid. Patent Document 1 shows an example of the structure. The carry-in and carry-out port is usually referred to as load port, which includes a stage onto which the FOUP is placed from outside. In more detail, the load port is configured to urge the stage toward a partition wall by a drive mechanism such as a motor or an air cylinder, so as to insert a key (i.e., opening/closing mechanism) into the key hole provided in the lid from the apparatus side through an opening formed in the partition wall. The key is then rotated and moved backward, so that the lid is removed.

As the semiconductor manufacturing apparatuses, various apparatuses adapted for respective processes for semiconductor manufacturing, such as a film deposition apparatus, an apparatus for forming a mask pattern, an etching apparatus, a cleaning apparatus and so on are used. Semiconductor substrates are sequentially transported among these apparatuses using the transport container. Since the number of semiconductor substrates to be processed per unit time increases more and more in recent years, the FOUP is used very frequently, and thus the failure occurrence probability of the FOUP becomes higher.

In a case of occurrence of an abnormality (failure) in the FOUP, a trouble such as falling of a component (e.g., lid) may occur. If such a trouble occurs in the load port, there is a possibility that the operation of the production line of the semiconductor manufacturing apparatuses should be stopped. It is thus desirable to detect the condition of the FOUP before the FOUP becomes abnormal.

Patent Document 1: JP2004-119427A

SUMMARY OF THE INVENTION

The present invention has been made in view of the above circumstances. The object of the present invention is to provide a technique of detecting, as soon as possible, an abnormality of a transport container for containing substrates and carrying them into a substrate processing apparatus.

A substrate processing apparatus of the present invention is a substrate processing apparatus that removes substrates from a transport container and processes the substrates, the transport container having a container main body whose substrate removal opening is air-tightly closed by a lid, and the transport container being configured to contain the substrates therein for transporting the substrates, said substrate processing apparatus including: a load port into and out of which the transport container is carried; and an apparatus controller that controls operations in the load port; wherein the apparatus controller includes: a storage unit that stores transition data of parameter values sent from outside based on a transport container identification code, wherein the transition data of the parameter values each includes a usage count of the transport container and a corresponding parameter value that quantifies a result of at least one of an operation performed to remove the lid after the transport container is carried into the load port and an operation performed to carry the container out of the load port; and a determination unit that determines, after a transport container is carried into the load port, presence or absence of an abnormality in that transport container based on a parameter value associated with at least one of carrying-in or carrying-out of that transport container, and past transition data of parameter values associated with that transport container.

A substrate processing system according to another invention is a substrate processing system including: a plurality of substrate processing apparatuses, each of the substrate processing apparatuses including: a load port into and out of which a transport container is carried, the transport container having a container main body whose substrate removal opening is air-tightly closed by a lid, and the transport container being configured to contain the substrates therein for transporting the substrates; a processing section that processes each of the substrates which is removed from the transport container having been carried into the load port; and an apparatus controller that controls operations in the load port; and a host computer that communicates with each of the substrate processing apparatuses, wherein the host computer includes: a storage unit that stores transition data of parameter values sent from outside based on a transport container identification code, wherein the transition data of the parameter values each includes a usage count of the transport container and a corresponding parameter value that quantifies a result of at least one of an operation performed to remove the lid after the transport container is carried into the load port and an operation performed to carry the container out of the load port; and a determination unit that determines, after a transport container is carried into the load port, presence or absence of an abnormality in that transport container based on a parameter value associated with at least one of carrying-in or carrying-out of that transport container, and past transition data of parameter values associated with that transport container.

A yet another invention is a method of detecting an abnormality in a transport container, the transport container having a container main body whose substrate removal opening is air-tightly closed by a lid, and the transport container being configured to contain the substrates therein for transporting the substrates, said method including: carrying the transport container into a load port of a substrate processing apparatus, the substrate processing apparatus being configured to remove the substrates and process the substrates; carrying the transport container out of the load port; storing transition data of parameter values sent from outside based on a transport container identification code, wherein the transition data of the parameter values each includes a usage count of the transport container and a corresponding parameter value that quantifies a result of at least one of an operation performed to remove the lid after the transport container is carried into the load port and an operation performed to carry the container out of the load port; and determining presence or absence of an abnormality in the transport container based on the transition date of the parameter values. An operation performed to attach the lid to the container main body is included in the operation performed to carry the transport container out of the load port.

According to the present invention, based on a transport container identification code, there are stored transition data of parameter values, wherein the transition data of the parameter values each includes a usage count of the transport container and a corresponding parameter value that quantifies a result of at least one of an operation performed to remove the lid after the transport container is carried into the load port and an operation performed to attach the lid to the container main body to carry the container out of the load port. After the transport container is carried into the load port, presence or absence of an abnormality in that transport container is determined based on a parameter value associated with at least one of carrying-in or carrying-out of that transport container, and past transition data of parameter values associated with that transport container. Thus, an abnormality in a transport container can be detected as soon as possible.

DETAILED DESCRIPTION OF THE INVENTION

Figure 1:
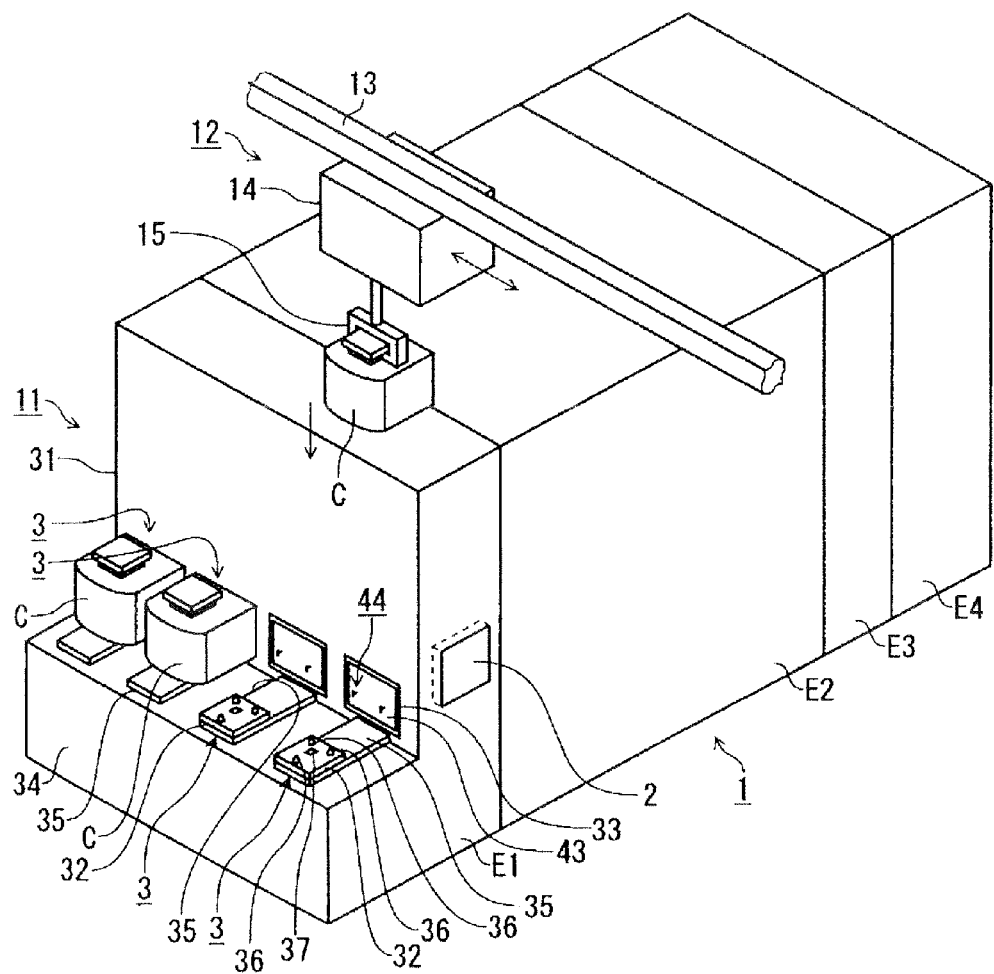
FIG. 1 is perspective view of a coating and developing apparatus that is a substrate processing apparatus to which the present invention is applied.

A coating and developing apparatus 1, which is an embodiment of a substrate processing apparatus of the present invention, is described with reference to FIG. 1. FIG. 1 is a perspective view of the coating and developing apparatus. The coating and developing apparatus 1 is installed in a clean room of a semiconductor manufacturing factory, and is composed of a carrier block E1, a processing block E2 and an interface block E3 which are connected linearly. An exposure apparatus E4 is connected to the interface block E3 on the opposite side to the processing block E2 side. A space outside of the coating and developing apparatus 1 is a transport area 11 for a carrier C containing wafers W (i.e., substrates). A below-described carrier transport mechanism 12 transports the carrier in the transport area 11. The carrier C is a transport container referred to as "FOUP", for example.

Functions of the respective blocks are briefly described. The carrier block E1 is a block for delivering the carrier C to and from the carrier transport mechanism 12. The carrier block E1 also transfers wafers W between the carrier C having been transported to the carrier block E1, and the processing block E2. The carrier block E1 is described in detail below.

The processing block E2 is a block for performing various liquid processes to the wafers W, such as a resist coating process and a developing process, and a heating process. The exposure apparatus E4 exposes a resist film, which has been formed on each of the wafers W in the processing block E2. The interface block E3 transfers the wafers W between the processing block E2 and the exposure apparatus E4. The wafers W carried out from the carrier C are subjected sequentially to a resist coating process and a heating process in the processing block E2, and are exposed in the exposure apparatus E4. Thereafter, the wafers W are subjected sequentially to a heating process and a developing process, and then are returned to that carrier C.

An apparatus controller 2 that controls operations of the respective units of the coating and developing apparatus 1 is disposed, for example, on a side face of the carrier block E1. The apparatus controller 2 is a computer that transmits control signals to the respective units of the coating and developing apparatus 1. The carrier block E1 is controlled such that, upon receipt of a control signal, wafers W are carried into the below-described carrier block E1 and the wafers W are carried out from the carrier block E1. In addition, the respective blocks E1 to E3 are controlled such that, upon receipt of control signals, wafers W are transported among these blocks and are processed as described above.

Figure 2:
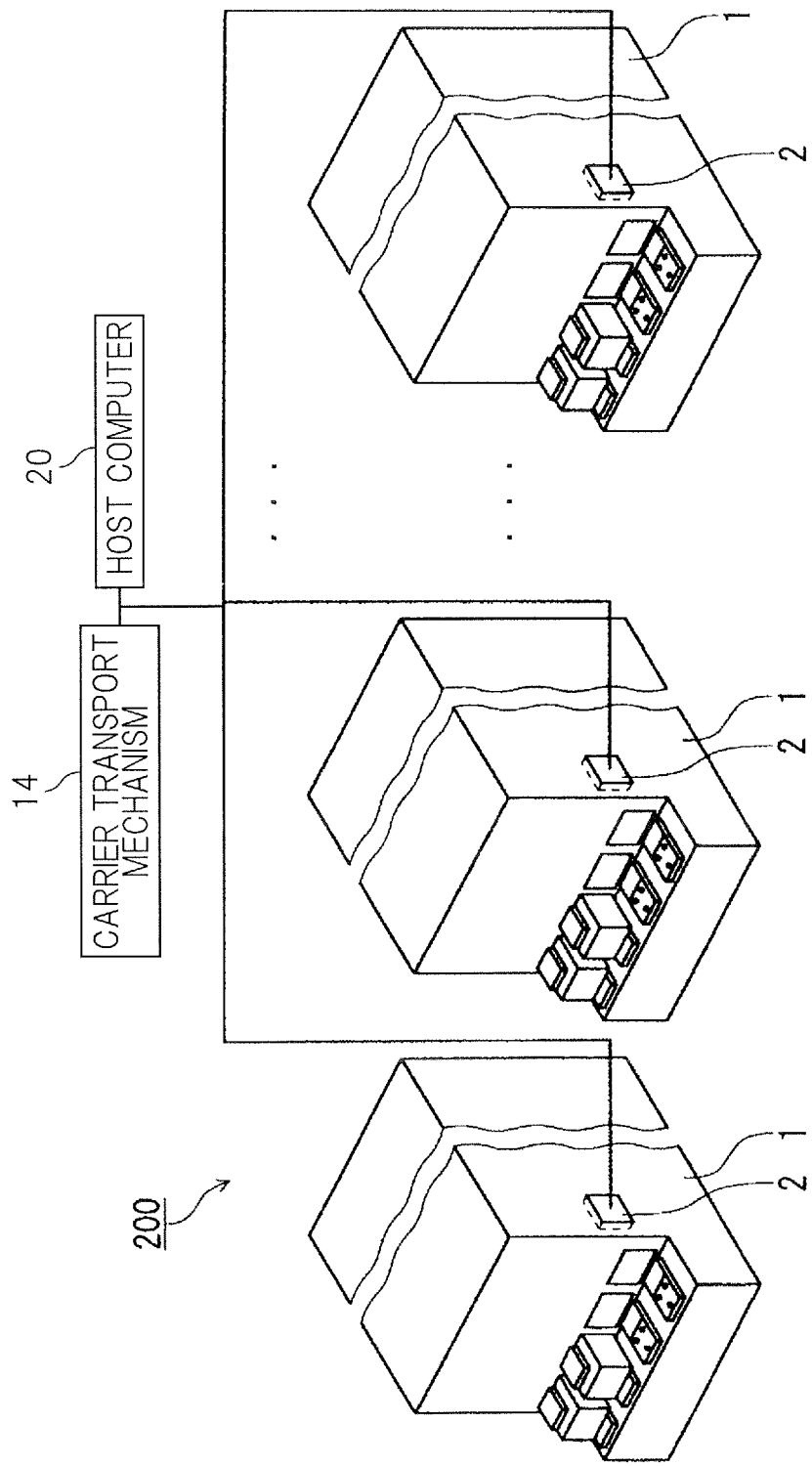
FIG. 2 is a block diagram of a system including the coating and developing apparatus and a host computer.

As shown in FIG. 2, a plurality of the coating and developing apparatuses 1 are installed in the clean room. The apparatus controllers 2 of the respective coating and developing apparatuses 1 are connected to a host computer 20 to constitute a substrate processing system 200. The apparatus controller 2 is described in detail below.

The host computer 20 transmits control signals to the carrier transport mechanism 12 thereby to control transport of the carrier C in the clean room. In addition, an ID number (identification codes) is assigned each carrier C, and an ID number is assigned to each wafer W in each carrier C. These ID numbers are transmitted to the apparatus controller 2.

Although FIG. 2 shows only the aforementioned coating and developing apparatuses 1, various substrate processing apparatuses for processing wafers W, such as a cluster apparatus including an etching unit for dry etching and a film deposition unit for depositing a film by CVD or PVD, a vertical type heat treatment apparatus for collectively heating wafer S, etc., are installed in the clean room. An inspection apparatus for performing a predetermined inspection to each wafer W is included in the substrate processing apparatuses. These various processing apparatuses other than the coating and developing apparatus 1 have blocks corresponding to the carrier block E1. In these processing apparatuses, carriers C are transferred to and from the processing apparatus and wafers W are transferred to and from the carriers C, in a manner similar to that in the coating and developing apparatus 1. Similarly to the coating and developing apparatus, 1, these processing apparatuses have their respective apparatus controller 2 connected to the host computer 20.

Many carriers C are transported in the clean room. Each carrier C is transported among the apparatuses in the clean room in an order set by the host computer 20, such that a carrier C is carried into one of the apparatuses, carried into other apparatuses, and then carried again into the one apparatus. That is, each carrier C is used repeatedly among the same apparatus and the different apparatuses.

The carrier transport mechanism 12 shown in FIG. 1 is described. The carrier transport mechanism 12, which is a so-called overhead hoist transport, includes a moving unit 14 that moves along a track 13 provided on a ceiling of the clean room, and a griping unit 15. The gripping unit 15 moves vertically (moved up and down) relative to the moving unit 14 and grips the carrier C, so that each carrier C can be transported among the aforementioned apparatuses in the clean room.

Next, the carrier block E1 is described in detail with reference also to the vertically-sectioned side views of FIGS. 2 and 3. For the convenience of explanation, the side of the carrier block E1 and the side of the interface block E3 are referred to as a rear side and a front side, respectively. The carrier block E1 has a housing 31. The housing 31 constitutes load ports 3, through each of which the carrier C is transferred to and from the carrier transport mechanism 12, and at each of which wafers W are transferred between the carrier C and the inside of the coating and developing apparatus 1.

In addition to the housing 31, each load port 3 includes a stage 32 on which the carrier C can be placed, a transport opening 33 for a wafer W, a door 4 for opening and closing the transport opening 33, and a mapping unit 6. The carrier block E1 is provided with the four load ports 3. A lower part of the housing 31 projects rearward to form a stepped part 34. The stages 32 of the respective load ports 3 are arranged laterally on the stepped part 34. The respective transport openings 33 are formed in a wall of the housing 31 in front of each stage 32.

The stage 32 moves forward and rearward to move the carrier C between a retreated position (unload position) and an advanced position (load position). In FIG. 3, the carrier C located at the unload position is shown by the chain lines. In FIG. 4, the carrier C located at the load position is shown. The carrier C is transported by the carrier transport mechanism 12 to the unload position. At the load position, wafers W are transferred to and from the carrier block E1. The stage 32 is connected to a stage moving mechanism 35. The forward movement and the rearward movement of the stage 32 are performed by the stage moving mechanism 35.

Three pins 36 project upward from a surface of the stage 32. When the carrier C is placed on the stage 32, these pins 36 are inserted and fit into recesses 51 formed in a bottom part of the carrier C, so as to prevent displacement of the carrier C on the stage 32. The stage 32 is provided with a clamp mechanism 37. The cross sectional view of the bottom part of the carrier C and the clamp mechanism 37 is shown in the dotted-line frame pointed by the chain-line arrow in FIG. 4. The reference numeral 52 depicts an engagement part provided in the carrier C.

A hook 38 provided on the clamp mechanism 37 is rotated by a rotation mechanism 39 comprising a motor. Thus, a condition in which the hook 38 is engaged with the engagement part 52 as shown by the solid lines in the frame, and a condition in which the engagement is released as shown by the chain lines, can be switched. When the engagement is formed, the carrier C is locked to the stage 32. The position of the hook 38 at which the engagement is formed which is shown by the solid lines is referred to as "locking position", while the position at which the engagement is not formed which is shown by the chain lines is referred to as "unlocking position".

Figure 5:
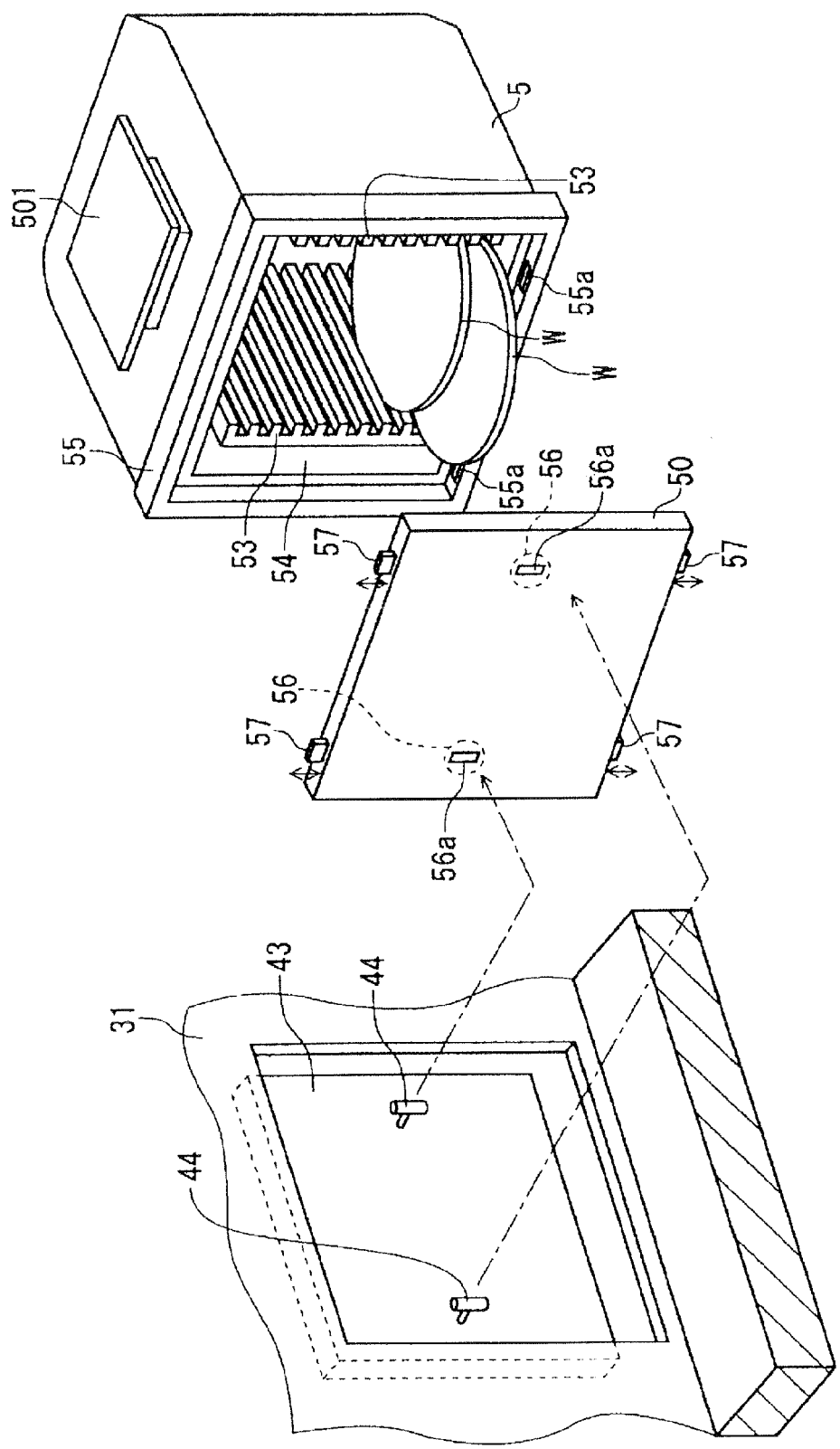
FIG. 5 is a perspective view of a door of the carrier block and the carrier.

The carrier C is described with reference also to FIG. 5. The carrier C is composed of a container main body 5 and a lid 50 detachably attached to the container main body 5. Support members 53 for supporting a peripheral portion of a back surface of a wafer W are formed at multiple levels on the right and left inner sides of the container main body 5. A removal opening 54 for wafer W is formed in a front face of the container main body 5. When the removal opening 54 is closed by the lid 50, airtightness of the interior of the container main body 5 is maintained. Engagement grooves 55a are formed in an upper part and a lower part of an inner circumferential side of the opening periphery 55 (the upper engagement grooves 55a are not shown). When the carrier C is located on the load position, the opening periphery 55 comes into close contact with an opening periphery of the transport opening 33, while the interior of the housing 3 and the transport area 11 are isolated from each other. A grip portion 51 to be gripped by the aforementioned carrier transport mechanism 12 for transporting the carrier C is provided on the top of the container main body 5.

The lid 50 is described. Right and left rotary members 56 are disposed inside the lid 50. Linear motion members 57 are disposed to extend vertically from the top and bottom of each rotary member 56. Upon rotation of the rotary member 56, the corresponding linear motion members 57 each move along a distance corresponding to the rotation amount of the rotation member 56, and are switched between a condition where ends of the linear motion members 57 project from the upper and lower edge of the lid 50, and a condition where these ends are retracted into the lid 50. When the ends of the linear motion members 57 are engaged with the engagement grooves 55 of the container main body 5, the lid 50 is engaged with the container main body 5 and is brought into a locking condition. Formed in each rotary member 56 is a key hole 56a, into which a below-described latch key 44 is inserted. Each rotary member 56 is rotated by rotating the corresponding latch key 44 inserted in the key hole 56a. Openings are formed in the front face of the lid 50 at positions corresponding to the key holes 56a so that the latch keys 44 can be inserted into the corresponding rotation members 56.

Next, the door 4 is described. The door 4 has a door main body 40 that closes the transport opening 33 from the inside of the housing 31. In FIG. 4, the door main body 40 located at a position to close the transport opening 33 is shown by the solid lines, which position is referred to as closing position. A door opening/closing mechanism 41 is connected to the door main body 40. In order to open the transport opening 33, the door main body 40 is moved by the door opening/closing mechanism 41 from the closing position to a separated position advanced from the closing position. Then, the door main body 40 is moved downward from the separated position by the door opening/closing mechanism 41 to an opening position shown by chain lines in FIG. 4, whereby the transport opening 33 is opened.

Figure 3:
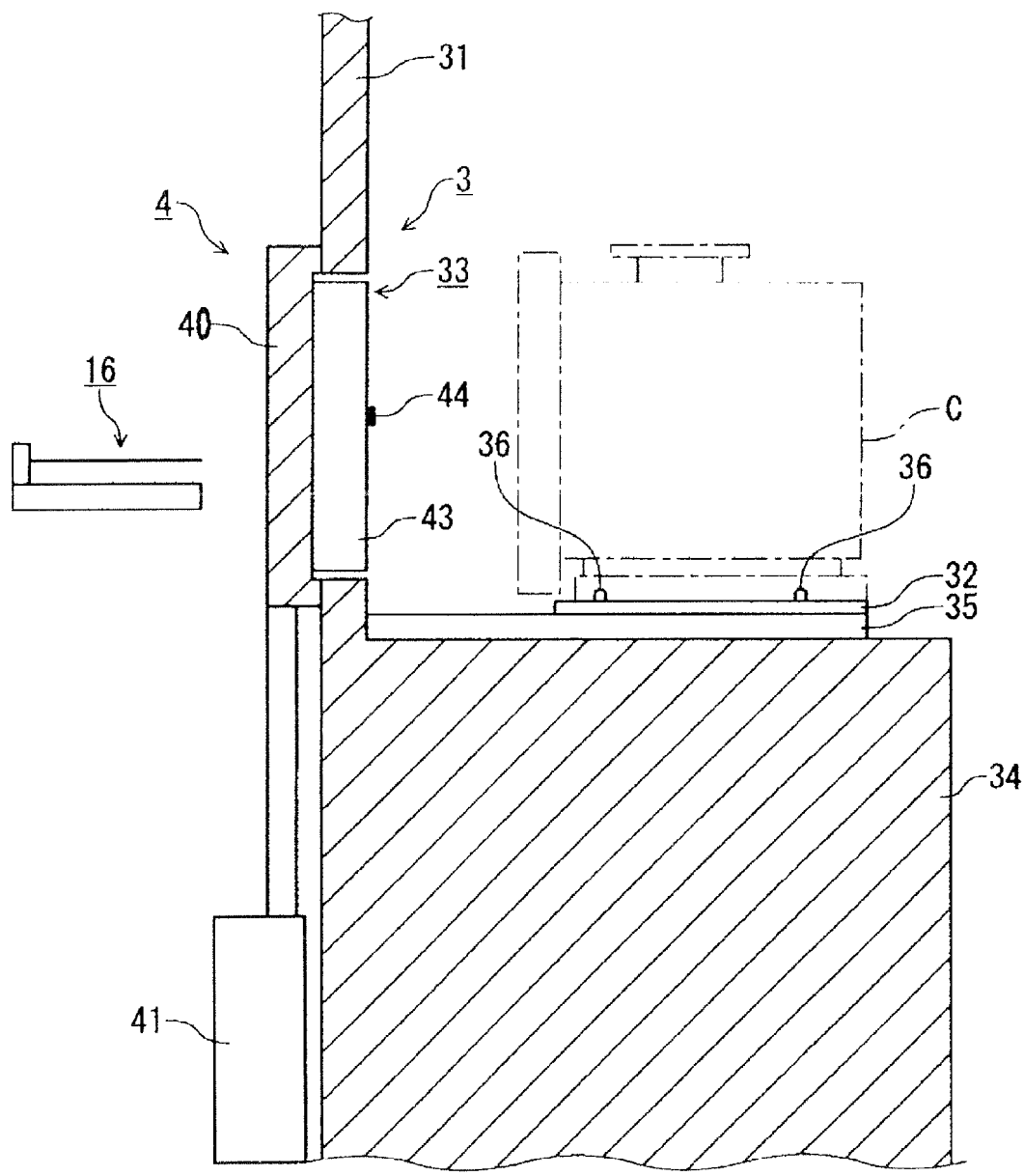
FIG. 3 is a side view of a carrier block of the coating and developing apparatus.
Figure 4:
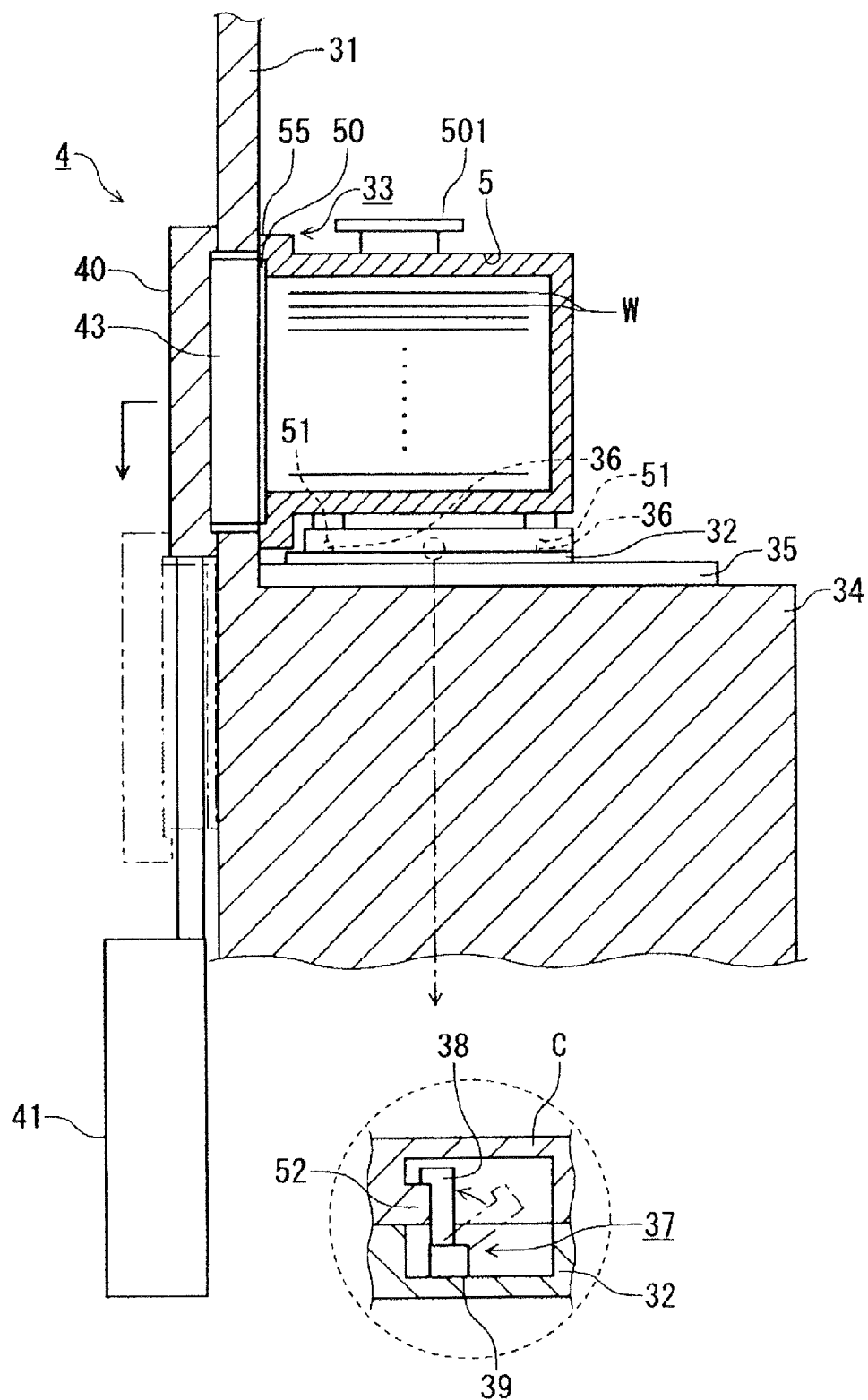
FIG. 4 is a side view of the carrier block of the coating and developing apparatus.

As shown in FIG. 3, a transfer mechanism 16, which is shared by the load ports 3, is disposed in the housing 31. Due to provision of the transfer mechanism 16, wafers W can be transferred between the carriers C and the processing block E2 through the opened transport openings 33.

The door 4 is provided, on the rear side of the door main body 40, with a lid opening/closing mechanism 43. The lid opening/closing mechanism 43 has, on its rear side, the latch keys 44. Each latch key 44 can be rotated about a horizontal axis by means of a motor (not shown) provided in the lid opening/closing mechanism 43. When the stage 32 moves the carrier C placed on the stage 32 forward and rearward, the latch keys 44 are inserted into and drawn from the key holes 56a of the rotary members 56.

Figure 6:
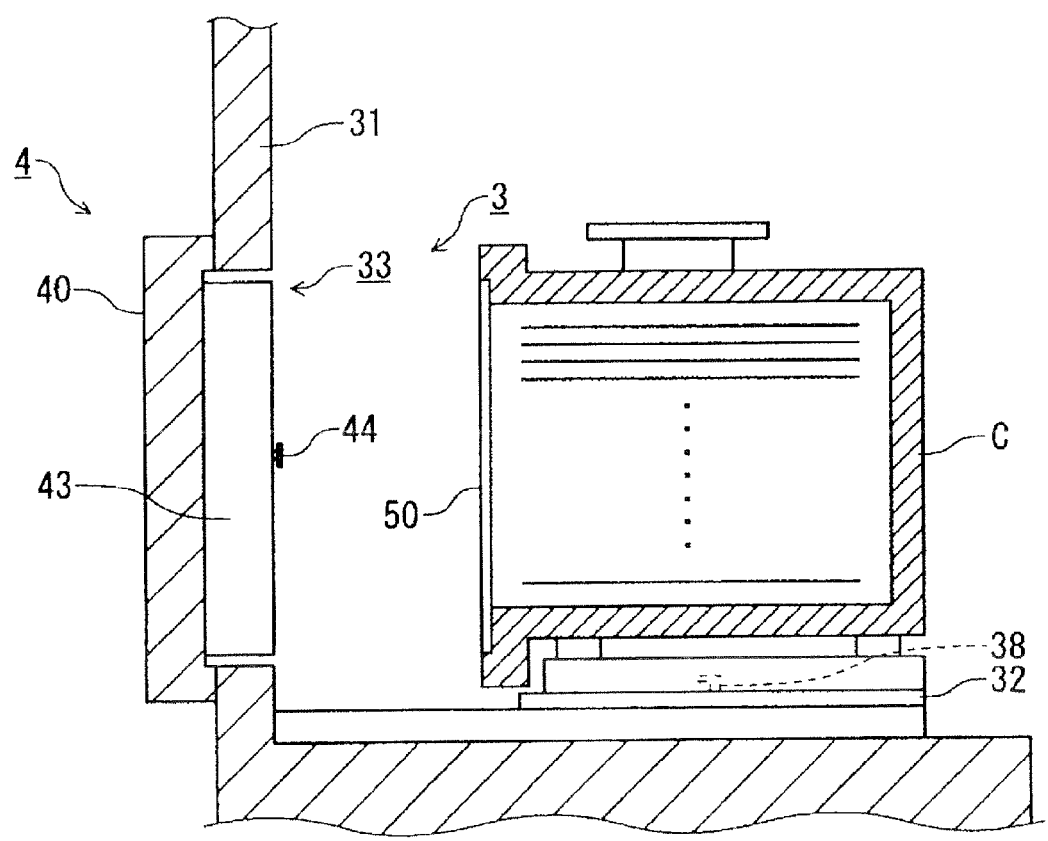
FIG. 6 is an explanatory drawing showing an opening and closing operation of the door.

A series of operations for placing a carrier C on the stage 32 and carrying wafers W in the carrier C into the apparatus are referred to as "loading process of carrier C". The loading process of carrier C is described step by step with reference to FIGS. 6 to 8. A carrier C is transferred from the carrier transport mechanism 12 to the stage 32 such that the carrier C is located in the unload position. Then, the hook 38 of the clamp mechanism 37 is moved from the unlocking position to the locking position, so that the carrier C is fixed to the sage 32 (FIG. 6). Then, the stage 32 is moved forward, whereby the carrier C is moved toward the load position.

Figure 7:
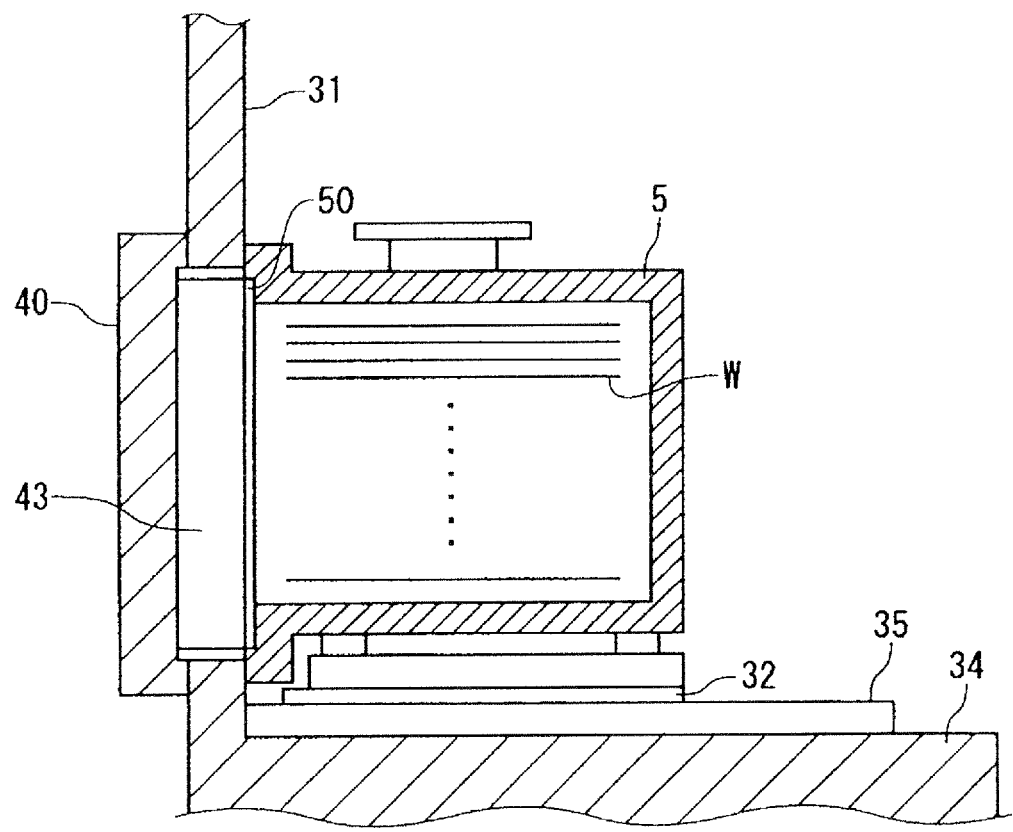
FIG. 7 is an explanatory drawing showing the opening and closing operation of the door.
Figure 8:
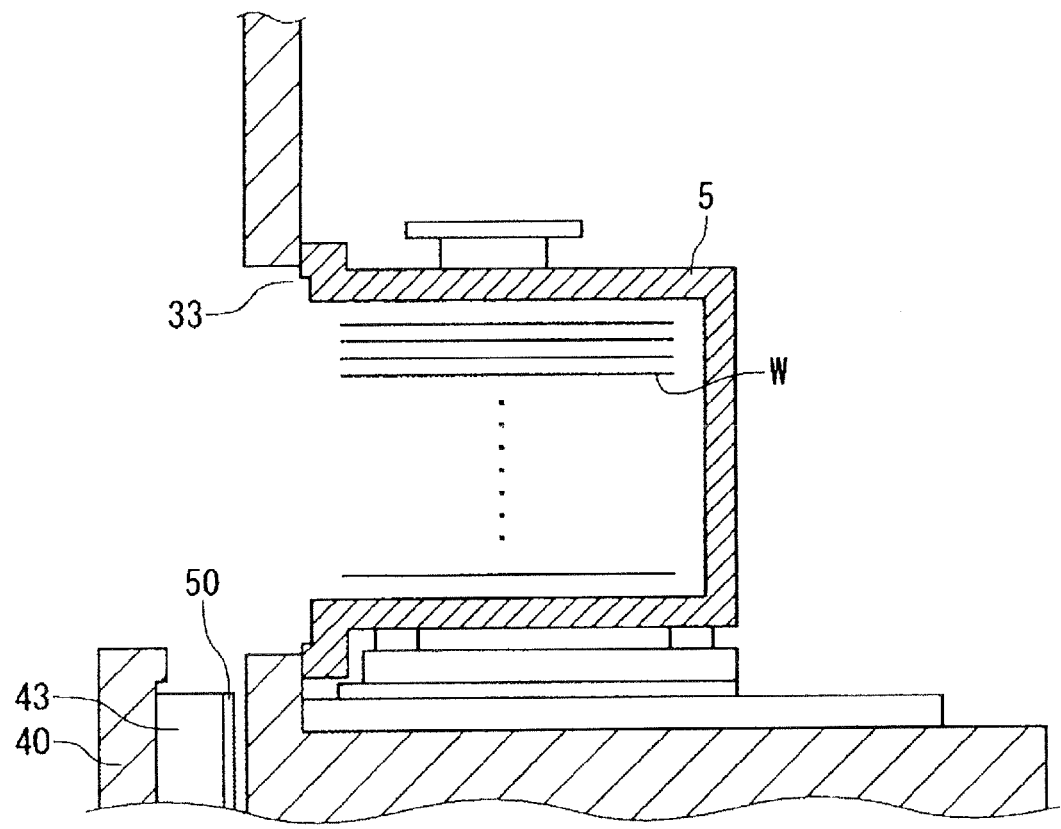
FIG. 8 is an explanatory drawing showing the opening and closing operation of the door.

The latch keys 44 are inserted into the key holes 56a, and the carrier C is located on the load position as shown in FIG. 7. Then, the latch keys 44 are rotated to release the engagement between the lid 50 and the container main body 5, and the lid 50 is held by the lid opening/closing mechanism 43. Thereafter, the door main body 40 is moved forward to the separated position separated from the housing 31, and is further moved downward to the opened position. Thus, as shown in FIG. 8, the transport opening 33 is opened. After that, wafers W in the container main body 5 are transported to the processing block E2.

A series of operations for returning the wafers W to the carrier C from the coating and developing apparatus 1, closing the transport opening 33, and carrying the carrier C out of the stage 32 is referred to as "unloading process of carrier C". In the unloading process of carrier C, operations reverse to the operations of the loading process of carrier C are performed. In detail, after the wafers W are returned to the carrier C, the door main body 40 is moved upward to the separated position, and is then moved to the closed position to close the transport opening 33. The lid 50 is pressed against the container main body 5. The latch keys 44 are rotated to engage the lid 50 and the container main body 5 with each other, and the lid 50 held by the lid opening/closing mechanism 43 is released. The carrier C is moved to the unload position. Thereafter, the hook 38 is moved from the locking position to the unlocking position so that the locking of the carrier C to the stage 32 is released. Then, the carrier C is transported to another apparatus by the carrier transport mechanism 12.

During the loading and unloading processes of carrier C, the apparatus controller 2 monitors torques of motors of the stage moving mechanism 35, the clamp mechanism 37, the lid opening/closing mechanism 43 and the door main body 40 to obtain the torque values as described below. In addition, the apparatus controller 2 monitors the time taken to rotate each motor from a predetermined position by a predetermined amount, and obtains a below-described time parameter.

When the engagement between the lid 50 and the container main body 5 is released in the loading process of carrier C, the torque of the motor of the lid opening/closing mechanism 43 varies. This is because, presence or absence of the friction between the linear motion member 57 and the engagement groove 55a changes between the situations, one being the situation where the linear motion member 57 is inserted into the engagement groove 55a to form the engagement, the other being the situation where the linear motion member 57 is withdrawn from the engagement groove 55a to release the engagement, there is no friction between the linear motion member 57 and the engagement groove 55a. The apparatus controller 2 can detect whether the engagement is released or not, based on the change of the torque.

Figure 9:
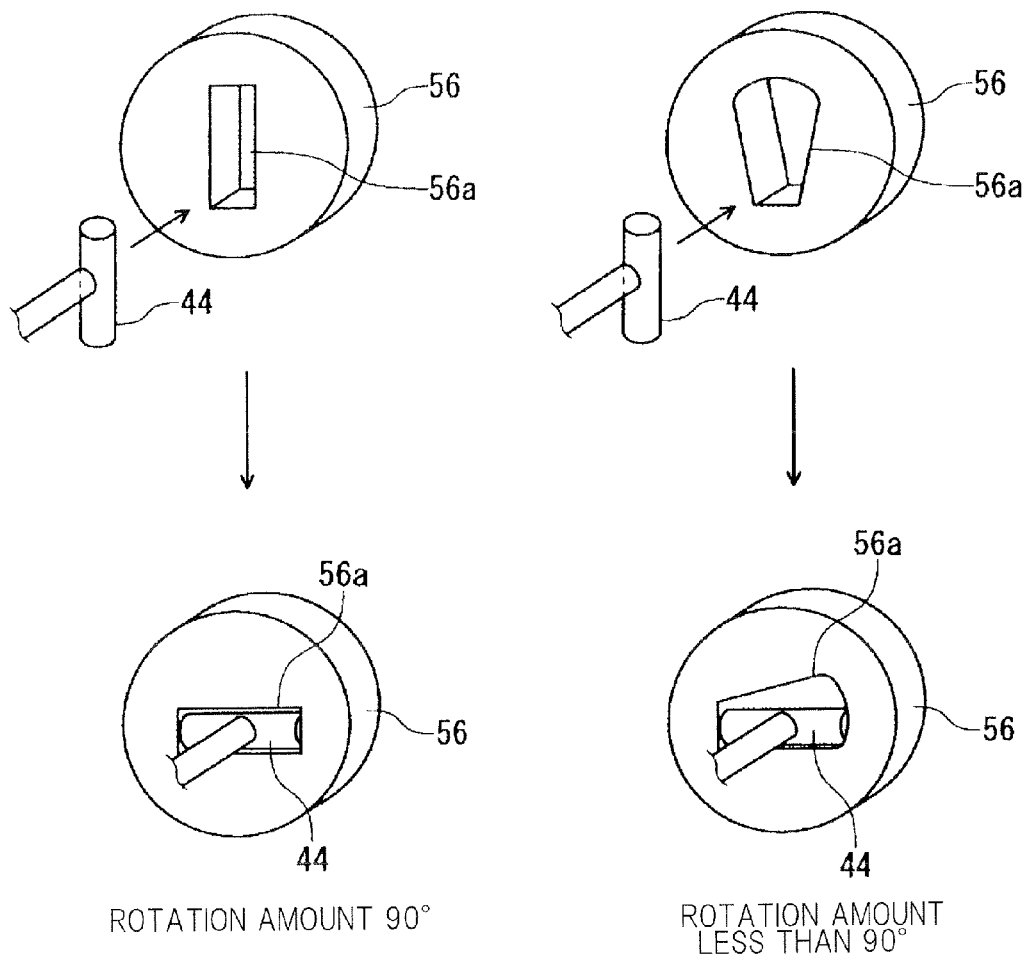
FIG. 9 is an explanatory drawing showing a rotation of a rotation unit of the carrier.

The engagement releasing operation is described in detail with reference to FIG. 9. If the key hole 56a of the rotation member 56 is shaped normally as shown in the upper left part, when the latch key 44 is engaged with the key hole 56a and is rotated at 90 degrees, the rotation member 56 is rotated at 90 degrees corresponding to the rotation of the latch key 44 as shown in the lower left part. Thus, the engagement is released.

On the other hand, after using the carrier C for a long time, the key hole 56a wears and enlarges as shown in the upper right part. That is, a play is formed between the key hole 56a and the latch key 44. Due to this play, even when the latch key 44 is rotated at 90 degrees, the rotation angle of the rotation member 56 may be less than 90°. In this case, the linear motion member 57 may be insufficiently drawn from the corresponding engagement groove 55a of the container main body 5 so that the engagement is not released.

When the apparatus controller 2 detects that the engagement is not released, the apparatus controller 2 controls the lid opening/closing mechanism 43 to perform an unlatch retry operation (retrying of releasing engagement) in which latch key 44 is reversely rotated to be returned to the position at which the latch key 44 was inserted into the key hole 56a, and then the latch key 44 is again rotated at 90° so as to release the engagement. As the wearing of the key hole 56a progresses so that the play between the key hole 56a and the latch key 44 is enlarged, the rotation member 56 is unlikely to be rotated in conformity to the latch key 44. Thus, the number of unlatch retry operations increases.

In addition, after long time use of the carrier C, the engagement part 52 of the carrier C is deformed by a stress received from the hook 38. In this case, the frictional force acting between the hook 38 and the engagement part 52 when the engagement therebetween is formed and when the engagement therebetween is released varies. Due to this, the clamping time required for the hook 38 to be moved from the unlocking position to the locking position, the unclamping time required for the hook 38 to be moved from the locking position to the unlocking position both vary. As described above, the apparatus controller can obtain the clamping time and the unclamping time to monitor the time required for a predetermined rotation of the motor.

In addition, in the loading operation of a carrier C, the stage 32 is moved so as to move the carrier C to the load position. The movement of the stage 32 continues until the carrier C is brought into contact with the housing 31 so that the load of the motor of the stage moving mechanism 35 increases whereby the torque value of the motor of the stage moving mechanism 35 varies. The time required for a carrier C to be moved from the load position to the unload position is referred to as "undocking time", while the time required for the carrier C to be moved from the unload position to the load position is referred to as "docking time". After long time use of the carrier C, the recess 51 of the carrier C wears and is enlarged, so that the pin 36 of the stage 32 cannot fit in the recess 51 well. In this case, the position at which the carrier C is fixed to the stage 32 by the clamp mechanism 37 is shifted. That is, since the position of the carrier C on the stage 32 changes, the docking time and the undocking time vary. The docking time and the undocking time are also obtained by the apparatus controller 2.

Next, the apparatus controller 2 is described with reference FIG. 10. The apparatus controller 2 includes a program storage unit 21, a CPU 22 and a memory 23, which are connected to a bus 24. The program storage unit 21 is formed of a computer storage medium such as a flexible disc, a compact disc, a hard disc, an MO (magneto optic disc), a memory card, etc. Programs 25 stored in the storage medium are installed into the apparatus controller 2.

The program 25 constituting the determination unit includes instructions (respective steps) such that control signals are transmitted to respective units of the coating and developing apparatus 1 to control their operations, whereby transport of wafers W, processes of the wafers W in the respective blocks E1 to E3, carrying-out of the wafers W from the carrier C and carrying-in of the wafers W to the carrier C can be performed. The CPU 22 executes various computing operations for outputting control signals.

Figure 10:
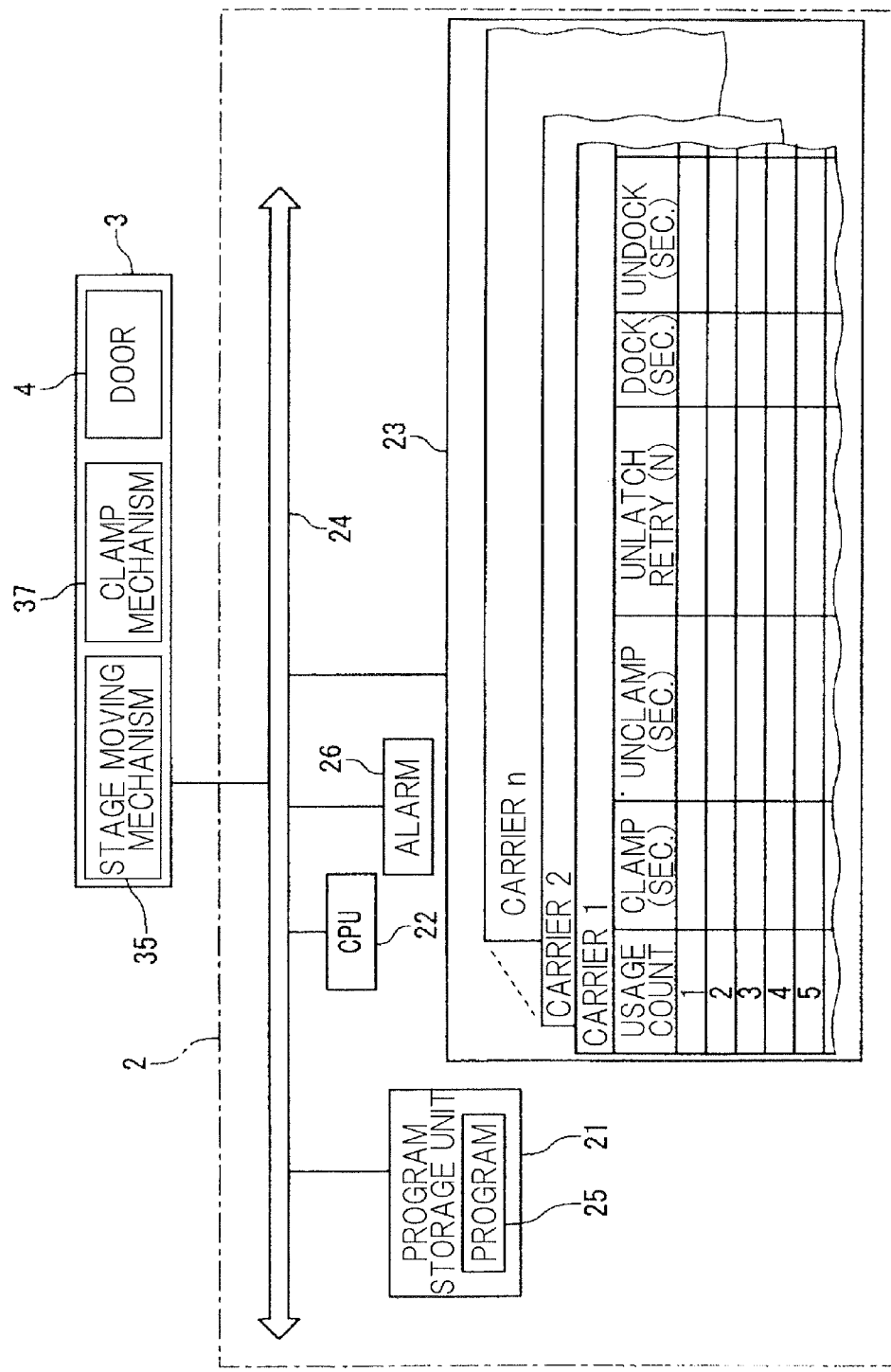
FIG. 10 is a block diagram showing the configuration of an apparatus controller.

As schematically shown in FIG. 10, the memory 23 stores the ID numbers (identification information) of the carriers C. In the illustrated example, the ID numbers are expressed by "1" to "n" ("n" is a natural number). When the loading and unloading processes of carrier C are performed in the coating and developing apparatus 1 having the apparatus controller 2, the memory 23 stores the time parameter values, i.e., the clamping time, the unclamping time, the docking time and the undocking time which are obtained in connection with the carrier C, in such a manner that the time parameter values are correlated with the ID number of the carrier C. The number of unlatch retry operations and the ID number are also stored in a correlated manner.

Although not shown, allowable values for the clamping time, the unclamping time, the docking time, the undocking time and the number of unlatch retry operations are set and are stored in the memory 23. Although not shown, similarly to the number of unlatch retry operations and so on, torque values of the motors of the stage moving mechanism 35, the clamp mechanism 37 and the lid opening/closing mechanism 43, which are parameter values detected during the loading process of carrier C and the unloading process of carrier C, are stored in the memory 23 such that these parameter values are correlated with the ID of the carrier C.

These parameter values are stored for every usage (usage count) of the carrier C. "Usage count of one" means that the loading process of carrier C and the unloading process of carrier C are performed respectively once in any one of the apparatuses in the substrate processing system 200. That is, if the $m^{th}$ ("m" is an integer) loading process and the $m^{th}$ unloading process are performed in the coating and developing apparatus 1, the $(m-1)^{th}$ parameter values in the unloading process are obtained in an apparatus to which the carrier C is transported immediately before the coating and developing apparatus 1, and the $(m+1)^{th}$ parameter values in the unloading process are obtained in an apparatus to which the carrier C is transported immediately after the coating and developing apparatus 1. The parameter values obtained by apparatuses other than the coating and developing apparatus 1 are transmitted to the coating and developing apparatus 1 through the host computer 200, and are stored in the memory 23 of the coating and developing apparatus 1. In addition, respective parameter values obtained by the coating and developing apparatus 1 are outputted to the other apparatuses through the host computer 20. That is, the parameter values obtained in the loading process of carrier C and the unloading process of carrier C are shared among the apparatuses constituting the substrate processing system 200.

In addition, the usage count is stored in the memory 23 while it is correlated with data specifying the apparatus and the load port 3 in which the processes corresponding to the usage count is performed. That is, when one carrier C is subjected to the loading process and the unloading process in one apparatus, the apparatus controller 2 of the one apparatus outputs to the other apparatuses the obtained parameter values, data identifying the load port 3 where these processes are performed, and data indicating the usage count (the total number of times for which the one carrier C has been used) corresponding to these processes. If the usage count data up to $A^{th}$ usage count data has been obtained by the one apparatus, the aforementioned data is outputted assuming that the current usage count of the one apparatus is $(A+1)^{th}$ usage count.

The bus 24 is provided with an alarm output unit 26. If it is determined that a carrier C has an abnormality in accordance with a below-described flow, the alarm output unit 26 informs the user of the ID of the carrier C, by displaying it on a screen or by outputting it phonetically. Similarly, if it is determined that a load port 3 has an abnormality, the alarm output unit 26 informs the user of information identifying the load port 3, by displaying it on a screen or by outputting it phonetically.

Figure 11:
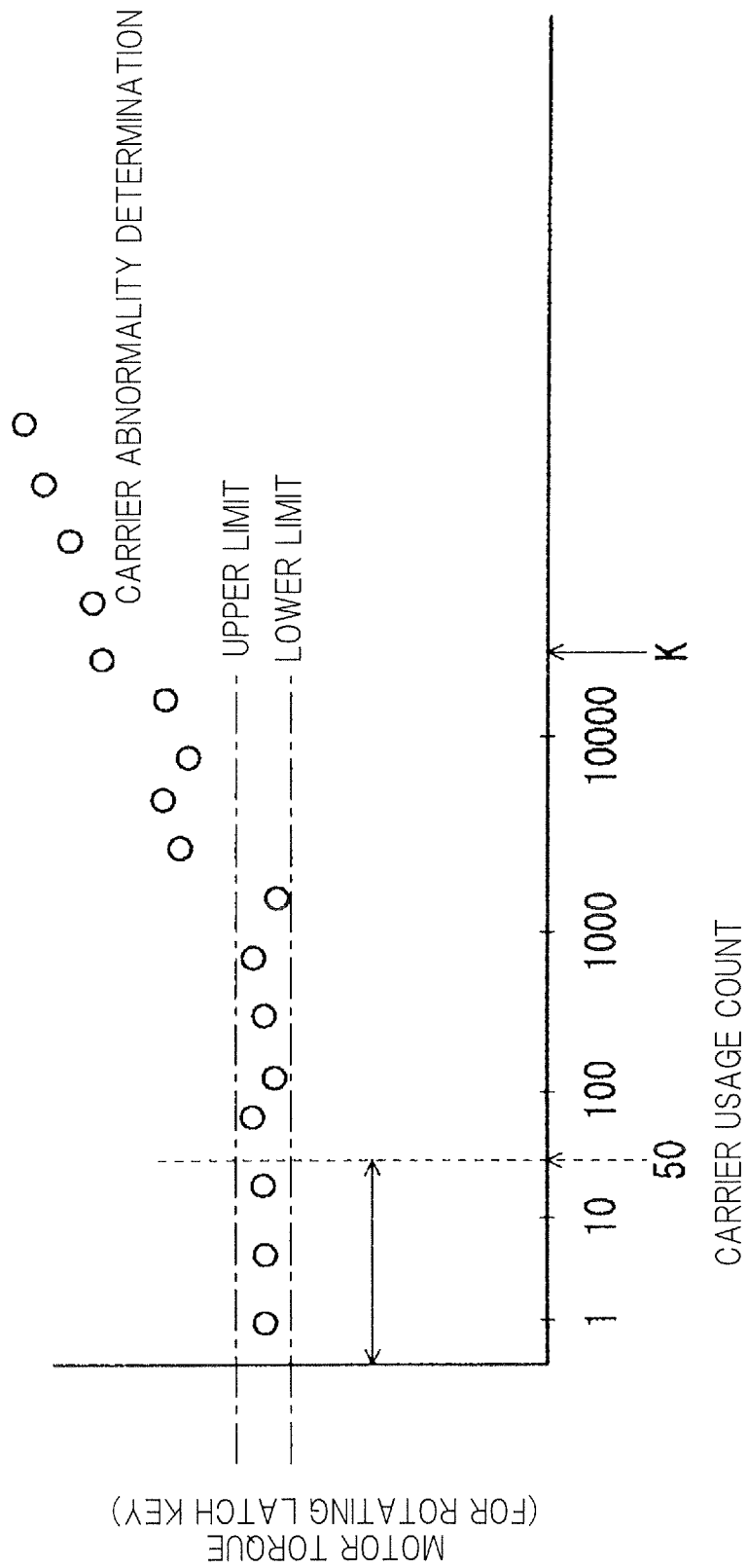
FIG. 11 is a graph showing an example of the relationship between a usage count of the carrier and a torque value.

An example of a method of determining abnormality of the load port 3 and the carrier C performed by the apparatus controller 2 is described. In FIG. 11, the vertical axis shows the torque of the motor of the lid opening/closing mechanism 43, where the torque is generated while the engagement between the lid 50 and the container main body 5 is released by rotating the latch key 44. The fact that unlatch retry operation is performed means that the releasing operation is performed plural number of times. The torque obtained when the releasing of the engagement is successfully performed is used as the torque data. The toque value increases toward the upper end of the vertical axis. The horizontal axis indicates the usage count (the number of times of use) of one carrier C. Only ten and several plots are shown in the graph for improving the visibility, although data is actually obtained for each time when the carrier C is used.

Long time use of the carrier C will result in a situation where the rotation member 56 is damaged by degradation so that the torque for rotating the rotation member 56 increases, or in a situation where the linear motion member 57 is damaged by degradation to facilitate the release of the engagement so that the torque decreases. Occurrence of such abnormalities is determined based on the torque.

The torque for releasing the engagement differs depending on the individual difference among carriers C. Thus, the allowable value for determining presence or absence of an abnormality is set for each carrier C. It is assumed that no degradation of the carrier occurs if the usage count of the carrier C is not more than fifty (50). The average of the fifty torque values corresponding to the fifty usages is calculated. An upper limit value is set by adding a preset value to the average value, and a lower limit value is set by subtracting a present value from the average value. An allowable range is defined between the upper limit value and the lower limit value.

As described above, since parameter values are shared among the apparatuses of the substrate processing system 200, an apparatus, which performs for example the $50^{th}$ loading process, calculates the average value, the upper limit value and the lower limit value, and transmits the calculated values to the other apparatuses. That is, the apparatus controller 2 of the coating and developing apparatus 1 obtained the calculate values by receiving them from another apparatus, or by calculating the values by itself, and stores the value in the memory 23.

After the upper limit value and the lower limit value, i.e., the allowable values, have been obtained, the average value, the upper limit value and the lower limit value are set for a carrier C (referred to as "carrier C1" for convenience of explanation). It is assumed that the carrier C1 is transported to one of the load ports 3 of the coating and developing apparatus 1 and that the detected torque value is an abnormal value deviating from the allowable range.

It is also assumed that the usage count of the carrier is "s" ("s" is an integer), when the abnormal value is detected. The larger the usage count of the carrier C is, the more the carrier C is likely to be deformed and damaged. Thus, the apparatus controller 2 determines whether the usage count exceeds a preset reference count "k" ("k" is an integer, k>50) or not. If the usage count "s" exceeds the reference count "k", it is determined that the carrier C1 has an abnormality. Although the reference count "k" is more than ten thousand in the graph, this is mere an example.

If the usage count "s" is not more than the reference count "k", there is a possibility that the carrier C is rapidly deteriorated, or that the load port 3 used in the coating and developing apparatus 1 has an abnormality. Thus, the apparatus controller 2 determines whether or not the torque values corresponding to the carrier C1 usage counts of "s–1", "s–2" . . . "s–p" (before the usage count of "s") are abnormal (where "p" is a preset integer). That is, it is determined whether or not the torque values were abnormal when the carrier C1 was transported to the apparatuses other than the coating and developing apparatus 1. If all the torque values corresponding to the usage counts of "s–1" to "s–p" are abnormal, it is determined that the carrier C1 has an abnormality.

In addition, it is determined whether or not there is an abnormality in the torque values that were obtained when a plurality of ("q" pieces of) carriers C (referred to as "carriers C2" for convenience of explanation) were transported to the load port 3 of the coating and developing apparatus 1 immediately before the carrier C1 and were subjected to the loading process and the unloading process (where "q" is a preset integer). That is, it is determined whether or not the torque values, which were obtained when other carriers C were handled in that load port 3, are abnormal. If all of these "q" pieces of carriers C2 have clamping times exceeding the allowable value, the apparatus controller 2 determines that the load port 3 has an abnormality.

If any one of the torque values of the carrier C1 corresponding to the usage counts of form "s–1" to "s–p" is normal, the determination on whether or not the carrier C1 is abnormal is not performed. If any one of the torque values of the "q" pieces of carriers C2 is normal, determination on whether or not the load port 3 is abnormal is not performed.

The explanation has been made for the example in which the abnormal determination of the carrier C and the load port 3 are performed based on the torque values of the motor of the lid opening/closing mechanism 43. Similarly, the average of torque values of the motors of the stage moving mechanism 35, the clamp mechanism 37 and the door 4 are also calculated, and upper limit values and lower limit values as allowable values are set based on the average values. Base on the allowable values, the determination on whether or not the load port 3 has an abnormality, and the determination on whether or not the carrier C has an abnormality are performed.

For example, the change of the shapes of the side surface of the lid 50 and the opening periphery 55 of the container main body 5 may result in the change of the motor torque of the door 4. The deformation of the engagement part 52 of the container main body may result in the change of the motor torque of the clamp mechanism 37. In addition, for example, if the opening periphery 55 of the container main body 5 is largely deformed so that it comes into contact with a floor surface during the movement of the stage 32, the motor torque value of the stage moving mechanism 35 may vary. That is, abnormalities of parts of the carrier C may affect the torque values of these motors. Thus, whether or not the carrier C has an abnormality can be determined by obtaining torque values of these motors and by comparing the obtained torques with the allowable values.

Figure 12:
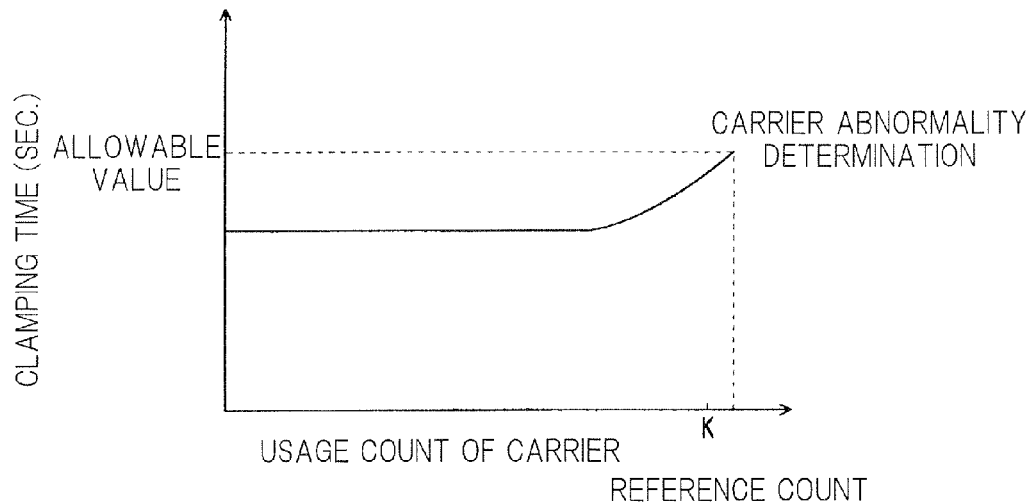
FIG. 12 is a graph showing an example of the relationship between a clamping time and a usage count of the carrier.

Another method of determining abnormality performed in the coating and developing apparatus 1 is described with reference to the graph in FIG. 12. FIG. 12 is a graph showing an example of a relationship between the usage count of one carrier C and the clamping time. The vertical axis of the graph indicates the clamping time (unit: second), and the horizontal axis indicates the usage count of the carrier C. Similarly to the abnormal determination based on the torque value, if the usage count "t" ("t" is an integer) of the carrier C exceeds a reference count "k" and if the clamping time exceeds the allowable value, the carrier C is determined to have an abnormality. Similarly to the upper limit value of the torque, the allowable value is set by calculating the average value of the fifty pieces of data of clamping time of one carrier C, and by adding a predetermined value to the average value.

Figure 13:
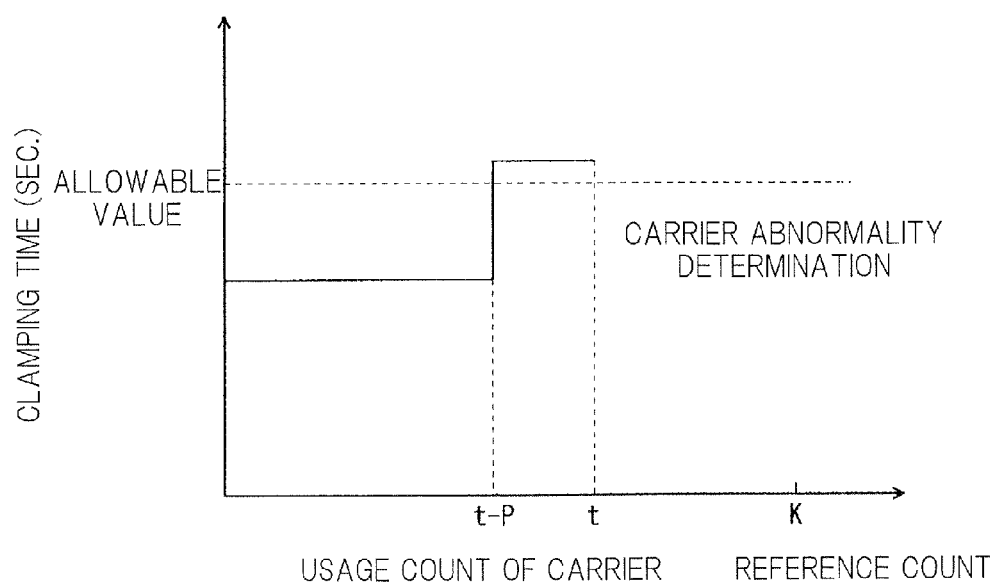
FIG. 13 is a graph showing an example of the relationship between a clamping time and a usage count of the carrier.

If the usage count "t" is not more than the reference count "k", the apparatus controller 2 determines whether or not the clamping times of the carrier C (referred to as carrier C3 for convenience of explanation) corresponding to the usage counts of the carrier C3 of from "t–1" to "t–p" (less than "t") exceed the allowable value. As shown in FIG. 13, if all the clamping times corresponding to these usage counts exceed the allowable value, the apparatus controller 2 determines that the carrier C3 has an abnormality. If any one of the clamping times does not exceed the allowable value, the determination on whether or not the carrier C3 is abnormal is not performed.

In addition, it is determined whether or not the clamping times, which were obtained when a plurality of ("q" pieces of) carriers C (referred to as "carriers C4" for convenience of explanation) were transported to the load port 3 of the coating and developing apparatus 1 immediately before the carrier C3 and were subjected to the loading process and the unloading process, exceed the allowable value. If all of these "q" pieces of carriers C4 have their clamping times exceeding the allowable value, the apparatus controller 2 determines that the load port 3 has an abnormality. If any one of the "q" pieces of carriers C4 has a normal clamping time, the determination on whether or not the load port 3 is abnormal is not performed.

The explanation has been made for the example in which the abnormal determination is performed based on the clamping time. The determination on whether or not the carrier C is abnormal and the determination on whether or not the load port 3 is abnormal are also performed in a similar manner based on the unclamping time, the docking time, the undocking time and the number of unlatch retry operations, as well as the clamping time.

The above-described determinations by the apparatus controller 2 are performed by using the past transition data of parameter values which have been obtained by the memory 23. As is apparent from the aforementioned description, the past transition data of parameter values includes not only time-series data of parameter values but also the usage count data, past averages of the parameter values and so on.

Figure 14:
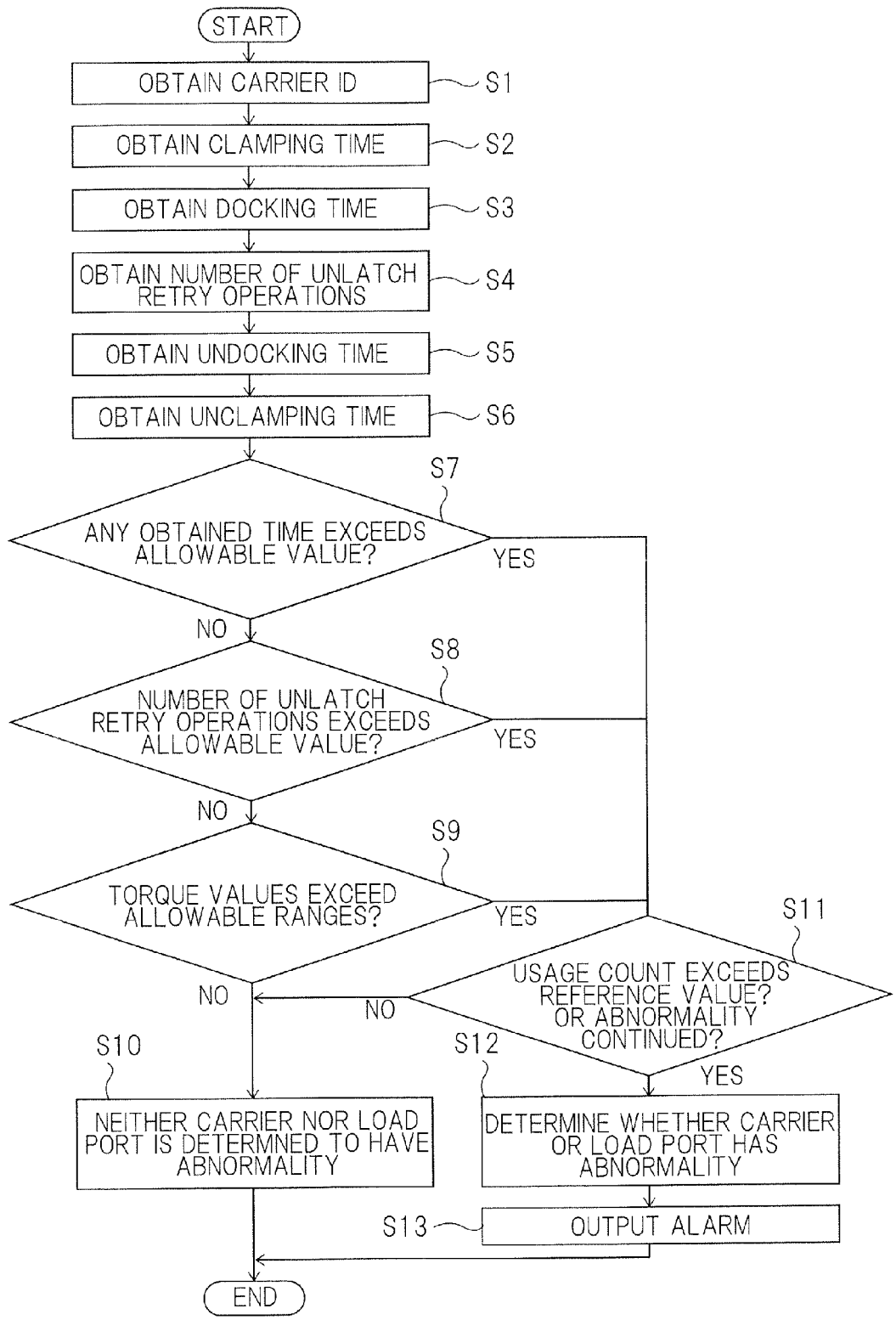
FIG. 14 is a flowchart showing the operation of the apparatus controller.

Next, a process performed by the coating and developing apparatus 1 is described step by step with reference to the flowchart of FIG. 14. Firstly, the apparatus controller 2 of the coating and developing apparatus 1 obtains the ID of a carrier C to be transported to the coating and developing apparatus 1, which is transmitted from the host computer 20 (step S1). Then, the carrier C having the ID is transported to the unload position by the carrier transport mechanism 12. As described with reference to FIG. 4, the hook 38 of the clamp mechanism 37 is moved from the unlocking position to the locking position, so that the carrier C is fixed onto the stage 32. The clamping time required for this movement, and the torque of the motor of the clamp mechanism 37 are obtained (step S2).

Following thereto, as shown in FIG. 7, the carrier C is moved to the load position by the stage moving mechanism 35. The torque of the motor of the stage moving mechanism 35 and the docking time required for this movement are obtained (step S3). Then, the lid opening/closing mechanism 43 is moved from the standby position to the lid transfer position. The engagement between the container main body 5 and the lid 50 is released by inserting the latch keys 44 into the key holes 56a of the rotation members 56 of the lid 50 and by rotating the latch keys 44. If releasing of the engagement is unsuccessfully done, the unlatch retry operation is performed. Until the engagement is released, the unlatch retry operation is performed repeatedly. The number of the retry operations and the torque of the motor of the lid opening/closing mechanism 43 when the engagement is released are obtained (step S4).

Following thereto, as shown in FIG. 8, the transport opening 33 is opened, and wafers W in the carrier C are transported to the processing block E2 by the transfer mechanism 16. The wafers W carried out from the carrier C are subjected to the coating and developing process. Then, after all the wafers W are returned to the original carrier C, the door 4 is returned from the opened position to the closed position so that the transport opening 33 is closed. Thereafter, the latch keys 44 are rotated so that the lid 50 and the container main body 5 are engaged with each other. At this time, the torque of the motor of the lid opening/closing mechanism 43 is obtained. The carrier C is moved to the unload position by the stage moving mechanism 35. At this time, the undocking time required for this movement and the torque of the motor of the stage moving mechanism 35 are obtained (step S5).

After that, the hook 38 of the clamp mechanism 37 is moved to the unlocking position by the clamp mechanism 37, and the unclamping time required for this movement and the torque of the motor of the clamp mechanism 37 are obtained (step S6). Thereafter, the carrier C is transported to the next apparatus by the carrier transport mechanism 12. During the above process, the acquisition of the time parameter values, the torque values and the number of unlatch retry operations are performed by the apparatus controller 2 as described above. In addition, these obtained parameter values are transmitted to the other apparatuses through the host computer 20.

The apparatus controller 2 determines whether or not the clamping time, the unclamping time, the docking time and the undocking time of the carrier C thus obtained exceed the respective allowable values set for these time parameters (step S7). If it is determined that none of the time parameter values exceed the allowable values, it is then determined whether or the number of unlatch retry operations exceeds the allowable value (step S8). If it is determined that the number of unlatch retry operations does not exceed the allowable value, it is then determined whether or not any one of the obtained torque values is abnormal (step S9). If it is determined none of the torque values are abnormal, it is determined that the carrier C and the load port 3 are normal (step S10).

If the step S7 determines that any of the obtained time parameter values exceeds the allowable values, it is then determined whether or not the usage count of the carrier C exceeds the reference count, as described with reference to FIGS. 12 and 13. If the usage count does not exceed the reference count, it is then determined whether or not the time parameter values related to the carrier C continuously exceeded the allowable value in the other load ports to which the carrier C was previously transported, and it is also determined whether or not the time parameter values of other carriers C, which were handled in the load port 3 in which the carrier C was handled, continuously exceeded the allowable value (step S11).

As described above, if it is determined the usage count of the carrier C exceeds the reference count and if it is determined that the time parameter value continuously exceeded in the other load ports 3, the carrier C is determined to have an abnormality. On the other hand, if it is determined that the time parameter values of other carriers C, which were handled in the load port 3 in which the carrier C was handled, continuously exceeded the allowable value, the load port 3 is determined to have an abnormality (step S12). If the carrier C or the load port 3 is determined to have an abnormality, an alarm informing the fact is outputted (step S13). Based on the alarm, the user of the substrate processing system 200 repairs the load port 3 or discards the carrier C.

If the step S11 determines that the usage count of the carrier C exceeds the reference count, and that the time parameter related to that carrier C did not continuously exceed the allowable value, and that the time parameters of other carriers C which were handled in the load port 3 did not continuously exceed the allowable value, the step S10 determines that neither the carrier C nor the load port 3 has an abnormality.

If the step S8 determines that the number of unlatch retry operations exceeds the allowable value, or if the step S9 determines that any of the obtained torques exceeds the allowable value, the step S11 is also performed similarly to the case where the time parameter value(s) exceeds the allowable value. That is, it is determined whether or not the usage count of the carrier C having abnormal parameter value(s) exceeds the reference count or not, it is also determined whether or not the same abnormality was continuously detected in other apparatuses to which that carrier C was transported previously, and it is also determined whether or not the same abnormality was continuously detected in the load port 3 of the coating and developing apparatus 1 when that load port 3 that handled the carrier C handled other carriers C. Based on these determinations, it is determined whether or not the carrier C has an abnormality (steps S11, S12). When the carrier C is determined to have an abnormality, an alarm is outputted (step S13). The aforementioned flow describes the operation of the one coating and developing apparatus 1. Also in each of the other apparatuses constituting the substrate processing system 200, the same operations as those performed in the coating and developing apparatus 1 are performed, and these operations are performed in parallel, for example.

In the substrate processing system 200, for each carrier C, the torque values of the motor constituting the load port 3 and the operation times of the respective units such as the stage 32 obtained in the loading process by which the carrier C is carried into the apparatus and in the unloading process by which the carrier C is carried out from the apparatus, and the number of unlatch retry operations of the lid 50 are stored in the memory 23 in a correlated manner, based on the ID number of the carrier C. When the carrier C is newly subjected to the loading process and the unloading process, an abnormality of the carrier C is determined based on newly-obtained data of the various parameter values and the past data that has been already stored in the memory 23. Thus, an abnormality of the carrier C can be detected at an early stage, stopping of the semiconductor manufacturing process due to an abnormality of the carrier C can be prevented.

In addition, in the substrate processing system 200, since the parameter values are shared among the apparatuses, parameter values obtained in the loading and unloading processes performed in one apparatus can be compared with parameter values obtained in the loading and unloading processes performed in another apparatus. Thus, when the parameter values obtained in the loading and unloading processes performed in the one apparatus is abnormal, it can be determined whether the abnormal parameter value is produced due to an abnormality of the carrier C or the load port 3. Thus, presence or absence of an abnormality of the carrier C can be determined precisely. Further, since an abnormality of the load port 3 can be detected at an early stage, throughput reduction of the semiconductor manufacturing apparatus due to abnormal transport of wafers W can be prevented.

In the above description, although the respective determinations in the aforementioned flow are performed by the apparatus controller 2, they may be performed by the host computer 20. In addition, in the aforementioned flow, the determination steps may be divided such that some determination step(s) are performed by the apparatus controller 2 and that other determination step(s) are performed by the host computer 20. The memory 23 that stores transition data of parameter values may be provided in the host computer 20 instead of the apparatus controller 2.

In the aforementioned example, the apparatus controller 2 transmits control signals whereby the respective units of the carrier block E1 operate automatically, and the parameter values are obtained as described above. Instead, the user of the apparatus may manually operate the respective units of the carrier block E1 through the apparatus controller 2, and the above parameter values may be obtained when the respective units operate by the manual operation.

It is not necessary that the parameter values are shared among the respective apparatuses, unlike the above embodiment. In this case, for example, the host computer 20 transmits data of the usage count of the carrier C to the coating and developing apparatus 1. Like the above embodiment, the apparatus controller 2 of the coating and developing apparatus 1 stores in the memory 23 the usage count and torque values of the respective motors obtained in the loading and unloading processes in a correlated manner. Then, like the aforementioned embodiment, the average of the torque values related to one carrier C is calculated and an allowable range is set. The average is calculated based on the data stored in the memory 23 which are obtained when the usage count of the carrier C is not more than 50, for example, similarly to the above example. After the allowable range is set, when the usage count exceeds the reference count "k" and the torque value related to the carrier C measured in the coating and developing apparatus 1 deviates from the allowable range, the carrier C is determined to have an abnormality.

In addition, the drive mechanism for driving each unit of the load port 3 is not limited to a motor. For example, an air cylinder may be used in place of the motor, and the pressure of the air cylinder may be detected in place of the torque.

The invention claimed is:

1. A substrate processing apparatus that removes substrates from a transport container and processes the substrates, the transport container having a container main body whose substrate removal opening is air-tightly closed by a lid, and the transport container being configured to contain the substrates therein for transporting the substrates, said substrate processing apparatus comprising:
    a load port into and out of which the transport container is carried; and
    an apparatus controller that controls operations in the load port;
    wherein the apparatus controller includes:
    a computing storage unit for storing transition data of parameter values sent from outside based on a transport container identification code, wherein the transition data of the parameter values each comprises a usage count of the transport container and a corresponding parameter value that quantifies a result of at least one of an operation performed to remove the lid after the transport container is carried into the load port and an operation performed to carry the container out of the load port; and
    a computing determination unit for determining, after a transport container is carried into the load port, presence or absence of an abnormality in that transport container based on a parameter value associated with at least one of carrying-in or carrying-out of that transport container, and past transition data of parameter values associated with that transport container, wherein the parameter value includes the number of retrying a lid unlocking operation for lid removal.

2. The substrate processing apparatus according to claim 1, wherein the parameter value includes a value related to drive for moving the transport container to a position, where the lid is removed from the transport container, after placing the transport container on the placement part.

3. The substrate processing apparatus according to claim 1, wherein the determination unit determines that an abnormality is present in the transport container, if the parameter value, which is obtained for the transport container whose usage count exceeds a set value, is abnormal.

4. A substrate processing system comprising:
    a plurality of substrate processing apparatuses, each of the substrate processing apparatuses including: a load port into and out of which a transport container is carried, the transport container having a container main body whose substrate removal opening is air-tightly closed by a lid, and the transport container being configured to contain the substrates therein for transporting the substrates; a processing section that processes each of the substrates which is removed from the transport container having been carried into the load port; and an apparatus controller that controls operations in the load port; and a host computer that communicates with each of the substrate processing apparatuses, wherein the host computer includes:

a computing storage unit for storing transition data of parameter values sent from outside based on a transport container identification code, wherein the transition data of the parameter values each comprises a usage count of the transport container and a corresponding parameter value that quantifies a result of at least one of an operation performed to remove the lid after the transport container is carried into the load port and an operation performed to carry the container out of the load port; and a computing determination unit for determining, after a transport container is carried into the load port, presence or absence of an abnormality in that transport container based on a parameter value associated with at least one of carrying-in or carrying-out of that transport container, and past transition data of parameter values associated with that transport container, wherein the parameter value includes the number of retrying a lid unlocking operation for lid removal.

5. The substrate processing system according to claim 4, wherein the parameter value includes a value related to drive for moving the transport container to a position, where the lid is removed from the transport container, after placing the transport container on the placement part.

6. The substrate processing system according to claim 4, wherein the determination unit determines that an abnormality is present in the transport container, if the parameter value, which is obtained for the transport container whose usage count exceeds a set value, is abnormal.

7. The substrate processing system according to claim 4, wherein, if the parameter value for one transport container whose usage count is not more than a set value and which parameter value is obtained in the load port of one of the substrate processing apparatuses is abnormal, the determination unit determines presence or absence of an abnormality in the load port based on another parameter value which is obtained for another transport container which is carried into the same load port before said one transport container is carried into the same load port.

8. The substrate processing system according to claim 4, wherein, if the parameter value for one transport container whose usage count is not more than a set value and which parameter value is obtained in the load port of one of the substrate processing apparatuses is abnormal, the determination unit determines presence or absence of an abnormality in the same transport container based on the parameter value which is obtained for the same transport container in another one of the substrate processing apparatuses before the same transport container is carried into said one substrate processing apparatuses.

9. A method of detecting an abnormality in a transport container, the transport container having a container main body whose substrate removal opening is air-tightly closed by a lid, and the transport container being configured to contain the substrates therein for transporting the substrates, said method comprising:

carrying the transport container into a load port of a substrate processing apparatus, the substrate processing apparatus being configured to remove the substrates and process the substrates;

carrying the transport container out of the load port;

storing transition data of parameter values sent from outside based on a transport container identification code, wherein the transition data of the parameter values each comprises a usage count of the transport container and a corresponding parameter value that quantifies a result of at least one of an operation performed to remove the lid after the transport container is carried into the load port and an operation performed to carry the container out of the load port; and determining presence or absence of an abnormality in the transport container based on the transition data of the parameter values, wherein the parameter value includes the number of retrying a lid unlocking operation for lid removal.

10. The method of detecting an abnormality in a transport container according to claim 9, wherein the parameter value includes a value related to drive for moving the transport container to a position, where the lid is removed from the transport container, after placing the transport container on the placement part.

11. The method of detecting an abnormality in a transport container according to claim 9, wherein it is determined that an abnormality is present in the transport container, if the parameter value which is obtained for the transport container whose usage count exceeds a set value.

12. The method of detecting an abnormality in a transport container according to claim 9, further comprising, if the parameter value for one transport container whose usage count is not more than a set value which parameter value is obtained in the load port of one of the substrate processing apparatuses is abnormal, determining presence or absence of an abnormality in the load port based on the parameter value which is obtained for another transport container which is carried into the same load port before said one transport container is carried into the same load port.

13. The method of detecting an abnormality in a transport container according to claim 9, wherein the determining of presence or absence of an abnormality in the transport container includes, if the parameter value for one transport container whose usage count is not more than a set value and which parameter value is obtained in the load port of one of the substrate processing apparatuses is abnormal, determining presence or absence of an abnormality in the same transport container based on the parameter value which is obtained for the same transport container in another one of the substrate processing apparatuses before the same transport container is carried into said one substrate processing apparatuses.

* * * * *